(12) United States Patent
Kouno

(10) Patent No.: US 9,595,500 B2
(45) Date of Patent: Mar. 14, 2017

(54) SEMICONDUCTOR DEVICE

(71) Applicant: DENSO CORPORATION, Kariya, Aichi-pref. (JP)

(72) Inventor: Kenji Kouno, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 14/898,531

(22) PCT Filed: Jun. 16, 2014

(86) PCT No.: PCT/JP2014/003182
§ 371 (c)(1),
(2) Date: Dec. 15, 2015

(87) PCT Pub. No.: WO2015/001727
PCT Pub. Date: Jan. 8, 2015

(65) Prior Publication Data
US 2016/0133597 A1 May 12, 2016

(30) Foreign Application Priority Data
Jul. 3, 2013 (JP) ................. 2013-139932

(51) Int. Cl.
*H01L 23/00* (2006.01)
*H01L 23/495* (2006.01)
*H01L 23/433* (2006.01)

(52) U.S. Cl.
CPC .......... *H01L 24/49* (2013.01); *H01L 23/4334* (2013.01); *H01L 23/4952* (2013.01);
(Continued)

(58) Field of Classification Search
None
See application file for complete search history.

(56) References Cited

U.S. PATENT DOCUMENTS 4,924,293 A * 5/1990 Saito ................... H01L 23/5286
257/370
5,621,257 A 4/1997 Kawakami
(Continued)

FOREIGN PATENT DOCUMENTS

JP 2001-148458 A 5/2001
JP 3366192 B2 1/2003
(Continued)

OTHER PUBLICATIONS

Clamels, A. "Advanced IGBT Driver—Applications Manual", Application Note 1903, Microsemi Power Products Group, Jul. 2006.*
(Continued)

*Primary Examiner* — Joseph Schoenholtz
(74) *Attorney, Agent, or Firm* — Posz Law Group, PLC

(57) ABSTRACT

A semiconductor device includes: a semiconductor chip having a switching element and multiple pads electrically connected to the switching element; and multiple lead terminals electrically connected to the respective pads. The multiple lead terminals include a control terminal used for control of on/off operation of the switching element, and a main terminal into which a main current flows when the switching element is in an on state. A coupling coefficient k falls within a range of −3%≤k≤2%, where the coupling coefficient k is defined by a parasitic inductance Lg in a current path of a control current flowing in the control terminal, a parasitic inductance Lo in a current path of the main current, and a mutual inductance Ms of the parasitic inductances Lg and Lo.

7 Claims, 14 Drawing Sheets

(52) U.S. Cl.
CPC .. *H01L 23/49524* (2013.01); *H01L 23/49537* (2013.01); *H01L 23/49562* (2013.01); *H01L 23/49568* (2013.01); *H01L 23/49575* (2013.01); *H01L 24/40* (2013.01); *H01L 24/73* (2013.01); *H01L 2224/05554* (2013.01); *H01L 2224/32245* (2013.01); *H01L 2224/33181* (2013.01); *H01L 2224/45014* (2013.01); *H01L 2224/48091* (2013.01); *H01L 2224/48247* (2013.01); *H01L 2224/4903* (2013.01); *H01L 2224/4917* (2013.01); *H01L 2224/49175* (2013.01); *H01L 2224/73215* (2013.01); *H01L 2224/73265* (2013.01); *H01L 2924/1305* (2013.01); *H01L 2924/13055* (2013.01); *H01L 2924/181* (2013.01)

(56) References Cited

U.S. PATENT DOCUMENTS

| | | |
|---|---|---|
| 2006/0108700 A1 | 5/2006 | Nakazawa et al. |
| 2009/0002956 A1 | 1/2009 | Suwa et al. |
| 2010/0148298 A1 | 6/2010 | Takano et al. |

FOREIGN PATENT DOCUMENTS

| | | | |
|---|---|---|---|
| JP | 2005-236108 A | | 9/2005 |
| JP | 2005236108 A | * | 9/2005 |
| JP | 3845644 B2 | | 11/2006 |
| JP | 2007-329383 A | | 12/2007 |
| JP | 2008-91618 A | | 4/2008 |
| JP | 2008091618 A | * | 4/2008 |
| JP | 2009005512 A | * | 1/2009 |
| JP | 4660214 B2 | | 3/2011 |

OTHER PUBLICATIONS

Machine Translation of JP 2009-005112,A.*
Machine Translation of JP 2005-236108.*
Machine Translation of JP-2008-091618,A.*
International Search Report of the International Searching Authority dated Jul. 8, 2014 issued in the corresponding International application No. PCT/JP2014/003182 (and English translation).
Written Opinion of the International Searching Authority dated Jul. 8, 2014 issued in the corresponding International application No. PCT/JP2014/003182 (and English translation).

* cited by examiner

SEMICONDUCTOR DEVICE

CROSS REFERENCE TO RELATED APPLICATION APPLICATIONS

This application is the U.S. national phase of International Patent Application No. PCT/JP2014/003182 filed on Jun. 16, 2014 and is based on Japanese Patent Application No. 2013-139932 filed on Jul. 3, 2013, the disclosures of which are incorporated herein by reference.

TECHNICAL FIELD

The present disclosure relates to a semiconductor device having multiple control terminals and multiple main terminals.

BACKGROUND ART

In general, a power switching element used in a power electronics field such as a power conversion or a power control has control terminals for controlling on/off operation of the element, and main terminals into which a current flows by the on/off operation, as its terminals.

PTL 1 discloses an insulated gate bipolar transistor (IGBT) as the power switching element. The IGBT has a gate terminal and a Kelvin emitter terminal as the control terminals, and has an emitter lead and a collector lead as the main terminals.

PRIOR ART LITERATURE

Patent Literature

PTL 1: JP 2008-91618 A

SUMMARY OF INVENTION

Problem to be Solved by Invention

However, in recent years, a drive frequency of the power switching element is becoming higher, and there arises a problem about a surge attributable to a magnetic coupling between terminals.

For example, in the IGBT, when a voltage is applied to the gate terminal to make the element in an on state, a magnetic flux is induced around a current path of a main current flowing between the collector lead and the emitter lead. An induced electromotive force is generated between the gate terminal and the Kelvin emitter terminal so as to restrict a change in the magnetic flux, and a voltage to be applied to the gate terminal is varied.

For example, when the voltage to be applied to the gate terminal increases to turn on the element, the main current increases more than a desired current value. In particular, in a configuration having a feedback circuit for keeping a constant voltage of the gate terminal, the main current may oscillate while repetitively increasing and decreasing by the induced electromotive force attributable to the main current and a voltage control made by the feedback circuit.

Conversely, when the voltage to be applied to the gate terminal decreases to turn off the element, a sufficient main current is not obtained. In other words, a longer time may be required to obtain the sufficient main current. That is, a response speed of the IGBT may be delayed.

The present disclosure has been made in view of the above issues, and aims at suppressing a magnetic coupling between a control current and an output current in a semiconductor device having control terminals and main terminals.

Means to Solve the Problem

A semiconductor device according to an aspect of the present disclosure includes: a semiconductor chip having a switching element and multiple pads electrically connected to the switching element; and multiple lead terminals electrically connected to the respective pads. The multiple lead terminals include a control terminal used for control of on/off operation of the switching element, and a main terminal into which a current flows when the switching element in an on state. The control terminal includes a first terminal and a second terminal between which a control current flows through the semiconductor chip when the switching element is in the on state. The main terminal includes a third terminal and a fourth terminal between which a main current flows through the semiconductor chip when the switching element is in the on state. A coupling coefficient k satisfies $-3\% \leq k \leq 2\%$, when k is defined by $k=Ms/(Lg \times Lo)^{1/2}$ where Lg is a parasitic inductance in a current path of the control current, Lo is a parasitic inductance in a current path of the main current, and Ms is a mutual inductance of the parasitic inductances Lg, Lo.

The semiconductor device can sufficiently suppress a magnetic coupling between a current path of the main current and a current path of the control current.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Hereinafter, embodiments of the present disclosure will be described with reference to the accompanying drawings. In the following respective embodiments, parts identical with or equivalent to each other are denoted by the same symbols. As the directions, an x-direction, a y-direction orthogonal to the x-direction, and a z-direction perpendicular to an xy-plane defined by the x-direction and the y-direction are defined.

First Embodiment

First, a description will be given of a schematic configuration and effects of a semiconductor device according to this embodiment with reference to FIGS. 1 to 8.

Figure 1:
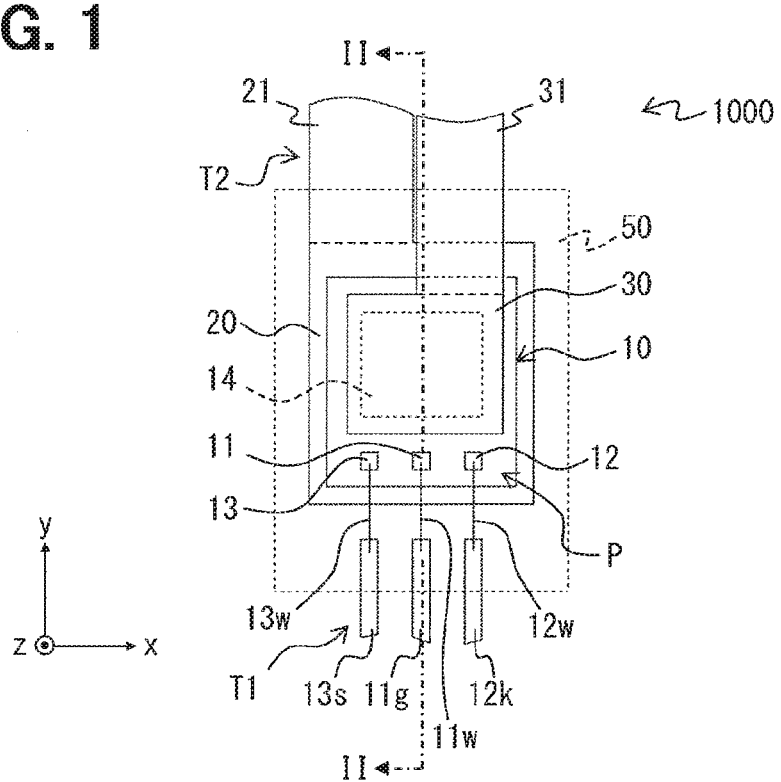
FIG. 1 is a top view illustrating a schematic configuration of a semiconductor device according to a first embodiment.
Figure 2:
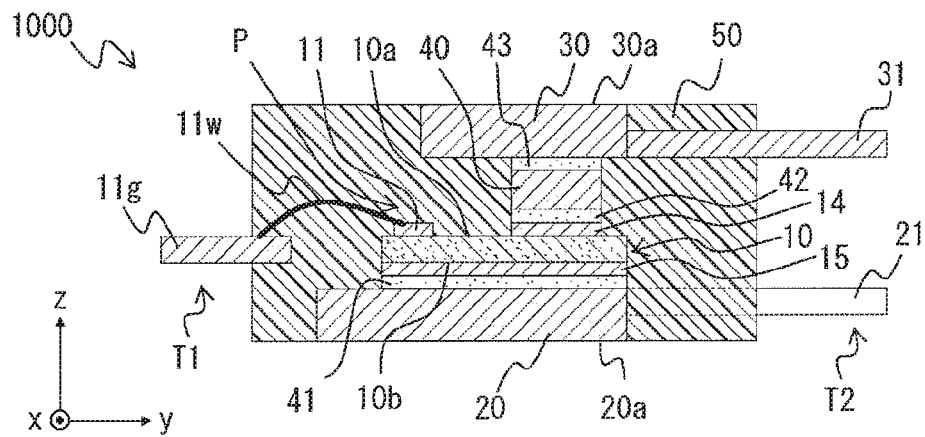
FIG. 2 is a cross-sectional view of the semiconductor device taken along a line II-II in FIG. 1.

As illustrated in FIG. 1, a semiconductor device 1000 includes an IGBT chip 10, heat sinks 20, 30, control terminals T1 (11g, 12k, 13s) as lead terminals, and main terminals T2 (21, 31). As illustrated in FIG. 2, the semiconductor device 1000 also includes a spacer 40 interposed between the second heat sink 30 to be described later and the IGBT chip 10. The above-mentioned components are molded with a sealing resin body 50 so as to project the respective parts of the control terminals 11g, 12k, 13s, and the main terminals 21, 31 to an external. In FIG. 1, the sealing resin body 50 per se is illustrated by a dashed line for the purpose of illustrating components within the sealing resin body 50.

The IGBT chip 10 is formed into a flat plate in which a planar shape along the xy-plane is rectangular. The IGBT chip 10 is formed with an insulated gate bipolar transistor as a switching element. As illustrated in FIG. 2, the IGBT chip 10 has a gate electrode 11, a Kelvin emitter electrode 12, a current sense electrode 13, and an emitter electrode 14 as pads P on one surface 10a orthogonal to the z-direction. The gate electrode 11 is an external connection electrode which is electrically connected to a gate of the insulated gate bipolar transistor through a gate line not shown. The Kelvin emitter electrode 12 is an external connection electrode which is electrically connected to an emitter of the insulated gate bipolar transistor through a Kelvin emitter line not shown. The current sense electrode 13 and the emitter electrode 14 are external connection electrodes which are electrically connected to the emitter of the insulated gate bipolar transistor not shown.

In particular, the gate electrode 11, the Kelvin emitter electrode 12, and the current sense electrode 13 are arranged side by side while being spaced apart from each other in the x-direction, on the one surface 10a, that is, on the same plane along the xy-plane. Those electrodes 11, 12, and 13 are electrically connected to a gate terminal 11g, a Kelvin emitter terminal 12k, and a current sense terminal 13s, which are the control terminals, through bonding wires 11w, 12w, and 13w. In this embodiment, as illustrated in FIG. 1, the gate terminal 11g, the Kelvin emitter terminal 12k, and the current sense terminal 13s are arranged side by side while being spaced apart from each other in the x-direction, on the same plane along the xy-plane, and the respective terminals extend from the IGBT chip 10 in the same y-direction. Parts of those terminals 11g, 12k, and 13s project from the sealing resin body 50. The gate terminal 11g is connected with a gate driver circuit 1100 to be described later. The gate driver circuit 1100 applies a voltage for driving the insulated gate bipolar transistor to the gate terminal 11g.

As illustrated in FIG. 2, the IGBT chip 10 has a collector electrode 15 as the pad P on a rear surface 10b opposite to the one surface 10a. The collector electrode 15 is electrically and mechanically connected to the first heat sink 20 through a conductive adhesive 41. The above emitter electrode 14 is electrically and mechanically connected to the spacer 40 through a conductive adhesive 42. The spacer 40 is electrically and mechanically connected to the second heat sink 30 through a conductive adhesive 43. In other words, the first heat sink 20, the IGBT chip 10, the spacer 40, and the second heat sink 30 are laminated on each other in the z-direction. The conductive adhesives 41, 42, and 43 can be made of, for example, solder.

A surface 20a of the first heat sink 20 opposite to a surface facing the collector electrode 15 is exposed from the sealing resin body 50 to the external in the surface along the xy-plane, and achieves a function of heat radiation. In addition, the first heat sink 20 is connected integrally with a collector terminal 21 as the main terminal, and electrically connects the collector electrode 15 to the collector terminal 21.

A surface 30a of the second heat sink 30 opposite to a surface facing the spacer 40 is exposed from the sealing resin body 50 to the external in the surface along the xy-plane, and achieves a function of heat radiation. In addition, the second heat sink 30 is connected integrally with an emitter terminal 31 as the main terminal. The emitter electrode 14 and the emitter terminal 31 are electrically connected to each other through the second heat sink 30 and the spacer 40.

As described above, as illustrated in FIGS. 1 and 2, the collector terminal 21 and the emitter terminal 31 in this embodiment are arranged to have different z-coordinates from each other. The collector terminal 21 and the emitter terminal 31 are extended from the IGBT chip 10 in a direction opposite to an extending direction of the control terminals 11g, 12k, and 13s in the y-direction. The collector terminal 21 and the emitter terminal 31 are arranged in such a manner that a distance between the respective terminals becomes zero when those terminals are positively projected onto the xy-plane. In other words, the collector terminal 21 and the emitter terminal 31 are arranged adjacent to each other without any gap.

Figure 3:
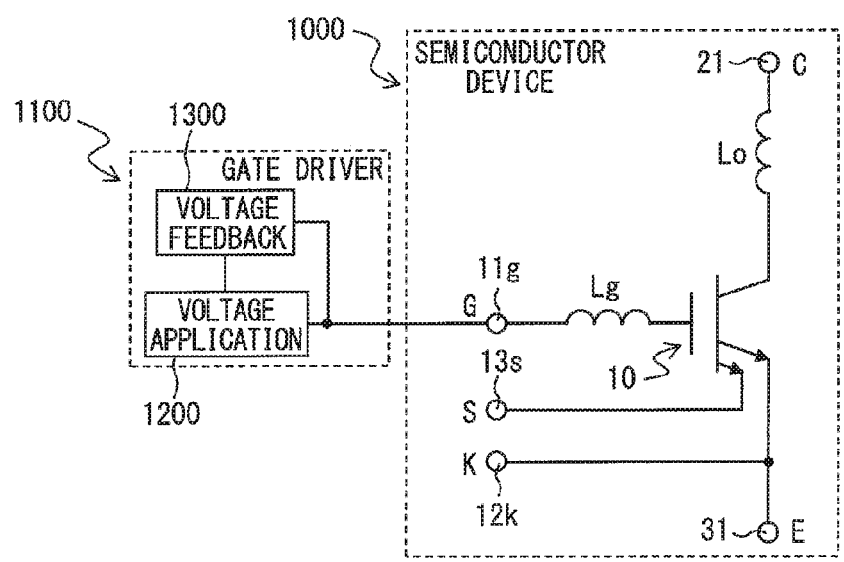
FIG. 3 is an equivalent circuit diagram of the semiconductor device and a peripheral circuit of the semiconductor device.

An equivalent circuit of the semiconductor device 1000 and a peripheral circuit of the semiconductor device 1000 according to this embodiment is illustrated in FIG. 3. The gate terminal 11g is connected with the gate driver circuit 1100 for applying a predetermined voltage to the gate terminal 11g.

The Kelvin emitter terminal 12k is a terminal for functioning as a feedback circuit of a control current flowing in the gate terminal 11g. In other words, when a voltage is applied to the gate terminal 11g, the control current flows between the gate terminal 11g and the Kelvin emitter terminal 12k to form a current path of the control current. The current sense terminal 13s is configured to extract a part of a main current flowing in the emitter terminal 31 for measurement of the current. The gate terminal 11g corresponds to a first terminal, and the Kelvin emitter terminal 12k corresponds to a second terminal.

A voltage is applied between the collector terminal 21 and the emitter terminal 31. For example, 650V is applied to the collector terminal 21, and the emitter terminal 31 is grounded to GND. When a predetermined voltage is applied to the gate terminal 11g, the main current flows between the collector terminal 21 and the emitter terminal 31 to form a current path of the main current. In other words, the collector terminal 21 corresponds to a third terminal, and the emitter terminal 31 corresponds to a fourth terminal.

The gate driver circuit 1100 includes a voltage applying unit 1200 and a voltage feedback circuit 1300. The gate driver circuit 1100 is configured to apply a predetermined voltage to the gate terminal 11g. The voltage applying unit 1200 is configured to output a predetermined voltage. The voltage feedback circuit 1300 monitors a potential of the gate terminal 11g in real time. If the above potential exceeds a predetermined threshold, or falls below the predetermined threshold, the voltage feedback circuit 1300 changes the voltage output by the voltage applying unit 1200 so that the voltage applied to the gate terminal 11g is held constant. In other words, the voltage feedback circuit 1300 is configured to hold the voltage applied to the gate terminal 11g at a predetermined voltage.

Incidentally, when the predetermined voltage for turning on the IGBT chip 10 is applied to the gate terminal 11g, the control current flows between the gate terminal 11g and the Kelvin emitter terminal 12k as described above. A parasitic inductance Lg depending on a shape of the path is present in the current path of the control current. The main current flows between the collector terminal 21 and the emitter terminal 31. Similarly, a parasitic inductance Lo depending on a shape of the path is present in the current path of the main current. Those two parasitic inductances Lg and Lo result in a magnetic coupling according to a mutual inductance Ms between those parasitic inductances Lg and Lo. In particular, the insulated gate bipolar transistor according to this embodiment is formed of a power semiconductor element in which the main current is extremely larger than the control current. For that reason, an influence of an induced electromotive force generated in the current path of the control current due to a change in a magnetic flux around the main current cannot be ignored. In other words, when the magnetic flux around the main current changes, the induced electromotive force is generated in the current path of the control current, and a potential of the gate terminal 11g is varied. When the potential of the gate terminal 11g is varied, a magnitude of the main current fluctuates according to the variation in the potential.

The degree of the magnetic coupling between the main current and the control current can be quantified with the use of a coupling coefficient $k=Ms/(Lg \times Lo)^{1/2}$ defined by the parasitic inductances Lo, Lg, and the mutual inductance Ms between those parasitic inductances. The coupling coefficient indicates that the magnetic coupling is stronger as an absolute value of the coupling coefficient k is larger.

In the following description, positive and negative signs of the coupling coefficient k is negative in a case where an orientation of the magnetic flux generated in the main current matches a direction of offsetting the magnetic flux generated by the control current, and positive in an opposite case, in a state where no induced current is generated immediately after the IGBT chip 10 turns on.

Figure 4:
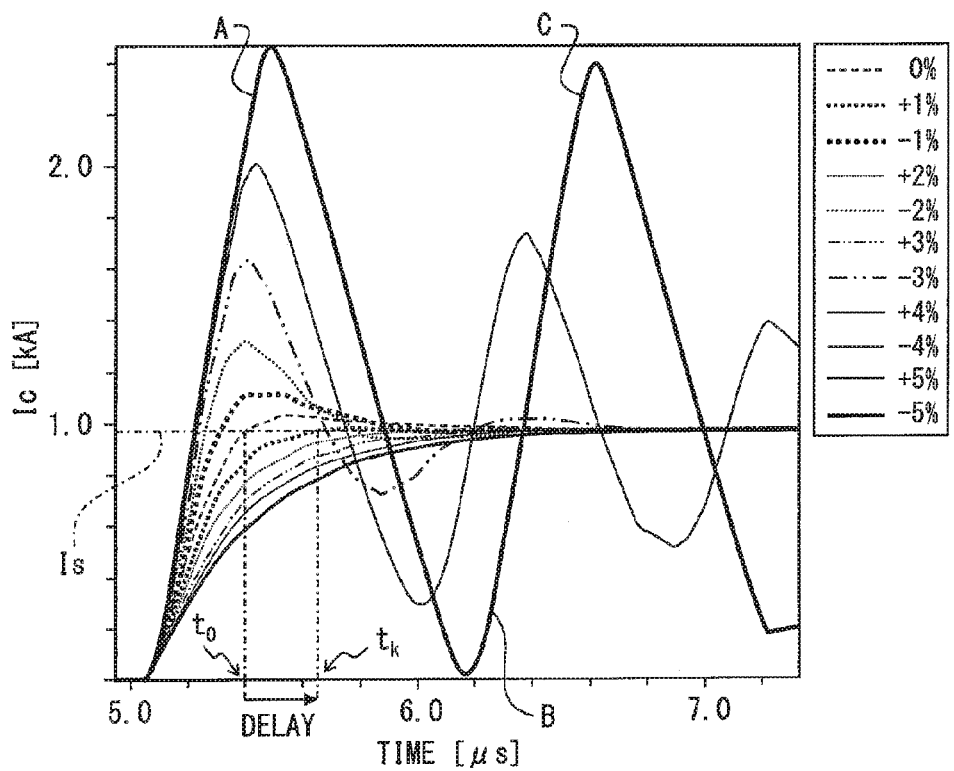
FIG. 4 is a graph illustrating a temporal change of a main current for each of coupling coefficients.

FIG. 4 illustrates a temporal change of the main current. In the present specification, the main current represents a current flowing from the collector terminal 21 toward the emitter terminal 31. FIG. 4 illustrates results of simulation in 1% increments from −5% to 5% with the coupling coefficient k as a variable.

First, a case in which the coupling coefficient k is negative will be described with reference to FIGS. 4 to 6.

Figure 5:
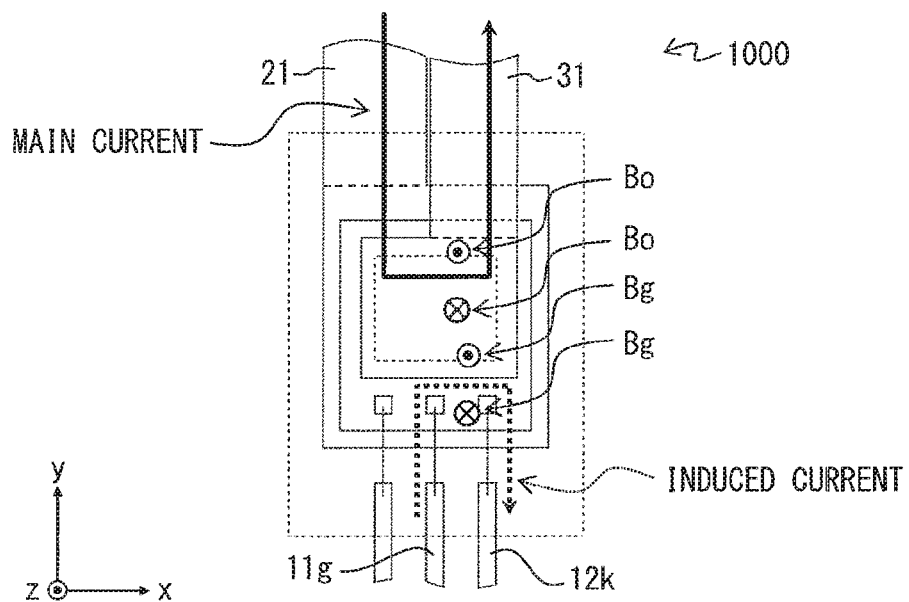
FIG. 5 is a diagram illustrating a direction along which an induced electromotive force is generated when a coupling coefficient k is negative.
Figure 6:
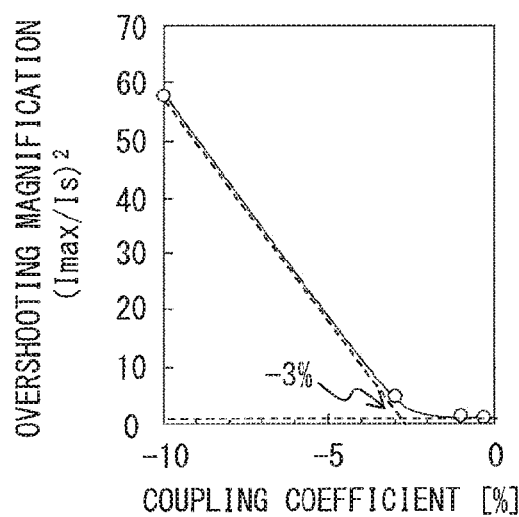
FIG. 6 is a graph illustrating an overshooting magnification for the coupling coefficient k when the coupling coefficient k is negative.

A main magnetic flux Bo generated by the main current (indicated by Ic in FIG. 4) flowing into the emitter terminal 31 from the collector terminal 21 is generated in a direction indicated by Bo in FIG. 5 according to the right-handed screw rule. A control magnetic flux Bg for offsetting the main magnetic flux Bo is oriented in a direction indicated by Bg in FIG. 5. That is, for the purpose of generating the control magnetic flux Bg, the control current flows from the gate terminal 11g toward the Kelvin emitter terminal 12k. In other words, in the case where the coupling coefficient is negative, when the main current flowing from the collector terminal 21 into the emitter terminal 31 increases, the potential of the gate terminal 11g rises because of the induced electromotive force.

When the potential of the gate terminal 11g rises, a value of the main current is increased. In other words, the value of an instantaneous main current increases as compared with a steady state value Is of the main current with a sufficient time after the IGBT chip 10 has turned on, and overshoot indicated by A in FIG. 4 is generated.

When the gate terminal 11g is brought into an overcharge state due to the induced electromotive force, an action of decreasing the potential of the gate terminal 11g is exerted by the voltage feedback circuit 1300. For that reason, the main current decreases. When the main current is varied to decrease, the induced electromotive force causing a current to flow into the gate terminal 11g from the Kelvin emitter terminal 12k is generated, and a potential of the gate terminal 11g is further reduced. In other words, as indicated by B in FIG. 4, the value of the instantaneous main current is decreased as compared with the steady state value Is of the main current.

When the potential of the gate terminal 11g falls below the predetermined value, an action of increasing the potential of the gate terminal 11g is exerted by the voltage feedback circuit 1300. For that reason, the main current increases. An increase in the main current again induces a rise of the potential of the gate terminal 11g. As a result, as indicated by C in FIG. 4, the value of the instantaneous main current increases as compared with the steady state value is of the main current.

As described above, when the coupling coefficient k is negative, an oscillation phenomenon of the main current is generated. As illustrated in FIG. 4, in the oscillation phenomenon, the amplitude becomes larger as the absolute value of the coupling coefficient k is larger. In other words, the amount of overshoot increases more as the absolute value of the coupling coefficient k is larger. FIG. 6 illustrates an overshoot magnification for the coupling coefficient k. The overshoot magnification is a value obtained by squaring a ratio of a maximum value Imax when the main current is overshot, to the steady state value Is of the main current. Referring to FIG. 6, when the coupling coefficient k is set to −3% or higher, as a result of which the overshoot can be suppressed.

Then, a case in which the coupling coefficient k is positive will be described with reference to FIGS. 4, 7, and 8.

Figure 7:
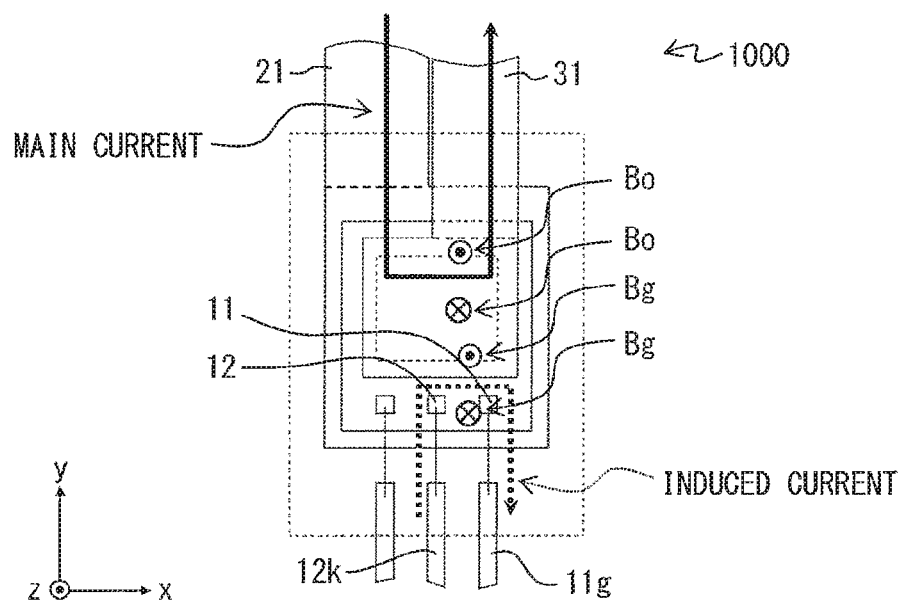
FIG. 7 is a diagram illustrating a direction along which the induced electromotive force is generated when the coupling coefficient k is positive.

Because the coupling coefficient k is positive, in the configuration illustrated in FIG. 7, the positions of the gate terminal 11g and the Kelvin emitter terminal 12k are replaced with each other in the above configuration.

A main magnetic flux Bo generated by the main current flowing into the emitter terminal 31 from the collector terminal 21 is generated in a direction indicated by Bo in FIG. 7 according to the right-handed screw rule. A control magnetic flux Bg for offsetting the main magnetic flux Bo is oriented in a direction indicated by Bg in FIG. 7. In other words, for the purpose of generating the control magnetic flux Bg, the control current flows from the Kelvin emitter terminal 12k toward the gate terminal 11g. In other words, in the case where the coupling coefficient is positive, when the main current flowing from the collector terminal 21 into the emitter terminal 31 increases, the induced electromotive force is generated to decrease the potential of the gate terminal 11g. The induced electromotive force becomes larger as the coupling coefficient k is larger. Therefore, it is more difficult to apply a predetermined voltage to the gate terminal 11g as the coupling coefficient k is larger. For that reason, a delay occurs until the main current reaches the steady state value Is.

Figure 8:
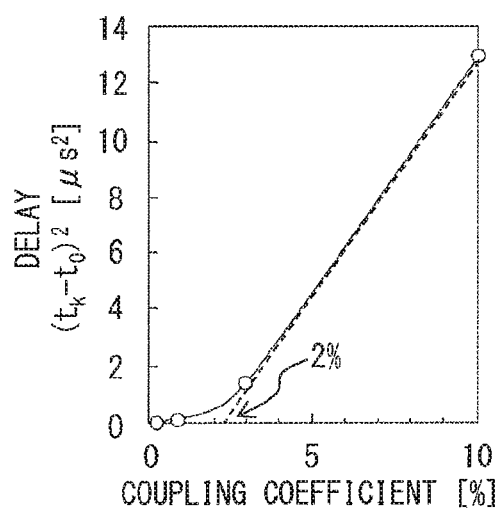
FIG. 8 is a graph illustrating a delay time for the coupling coefficient k when the coupling coefficient k is negative.

FIG. 8 is a graph illustrating a delay time for the coupling coefficient k. As illustrated in FIG. 4, a delay time is a value obtained by squaring a difference between a time t0 in an ideal state of k=0% and a time tk in the case of a predetermined coupling coefficient k, at a time when the main current first reaches the steady state value Is. FIG. 4 illustrates tk−t0 when k=1%. Referring to FIG. 8, when the coupling coefficient k is set to 2% or lower, a delay until the main current reaches the steady state value Is can be suppressed. In other words, a delay of a response speed of the switching element can be suppressed.

With the above configuration, when the coupling coefficient k falls within a range of −3%≤k≤2%, the overshoot of the main current, and the delay of the response speed of the switching element can be suppressed.

In the semiconductor device 1000 according to this embodiment, as described above, the collector terminal 21 and the emitter terminal 31 are extended in the y-direction opposite to the extending direction of the control terminals 11g, 12k, and 13s, and arranged so that the distance between those terminals when the collector terminal 21 and the emitter terminal 31 are projected onto the xy-plane is zero. For that reason, when the current path of the main current flowing into the emitter terminal 31 from the collector terminal 21 through the IGBT chip 10 is regarded as a one-turn coil, an area in which the main magnetic flux Bo is interlinked can be set to substantially zero. In other words, a strength of the main magnetic flux Bo attributable to the current path of the main current can be set to substantially zero, and the coupling coefficient k can be set to substantially zero. Therefore, the overshoot of the main current and the delay of the response speed of the switching element can be suppressed.

Second Embodiment

Figure 9:
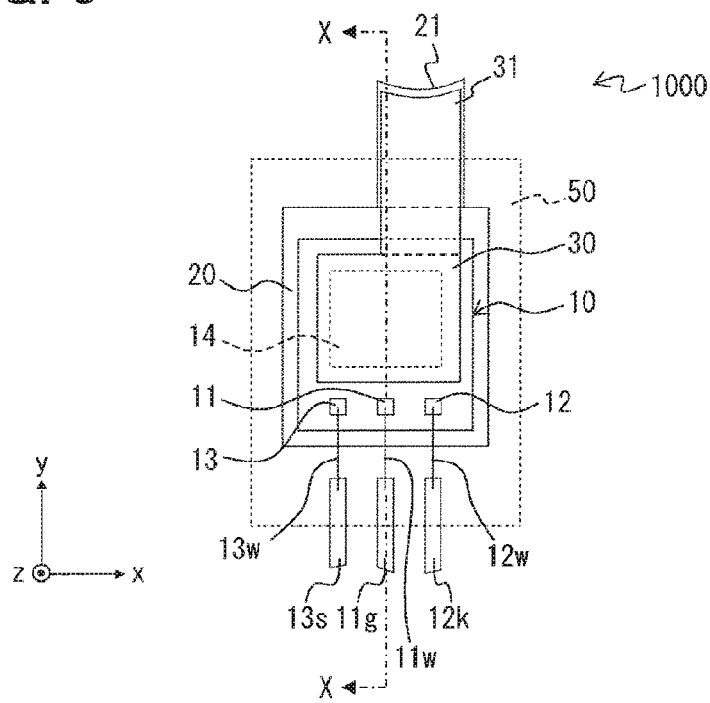
FIG. 9 is a top view illustrating a schematic configuration of a semiconductor device according to a second embodiment.

As illustrated in FIG. 9, a semiconductor device 1000 according to this embodiment is formed in such a manner that a collector terminal 21 and an emitter terminal 31 completely overlap with each other when those terminals 21 and 31 are positively projected onto an xy-plane, as compared with the first embodiment.

Figure 10:
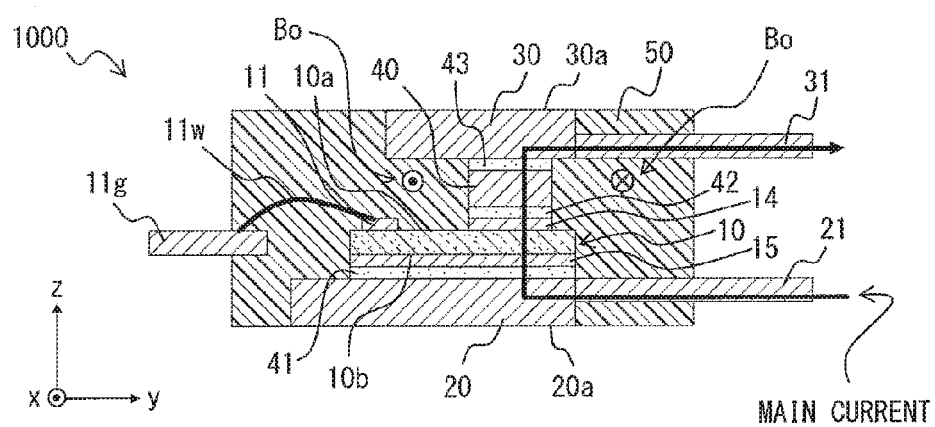
FIG. 10 is a cross-sectional view of the semiconductor device taken along a line X-X in FIG. 9.

In the above configuration, as illustrated in FIG. 10, a main magnetic flux Bo generated around a current path of a main current is produced in parallel to the xy-plane. On the other hand, because the gate terminal 11g and the Kelvin emitter terminal 12k are arranged on the same plane along the xy-plane, a current path of a control current is formed substantially in parallel to the xy-plane. In other words, the main magnetic flux Bo is substantially in parallel to the current path of the control current. For that reason, when the current path of the control current is regarded as a one-turn coil, the main magnetic flux Bo can be restricted from being interlinked with the current path of the control current. With the above configuration, the induced electromotive force can be restrained from being generated in the current path of the control current. In other words, the coupling coefficient k can be set to substantially zero. Therefore, the overshoot of the main current and the delay of the response speed of the switching element can be suppressed.

Third Embodiment

Figure 11:
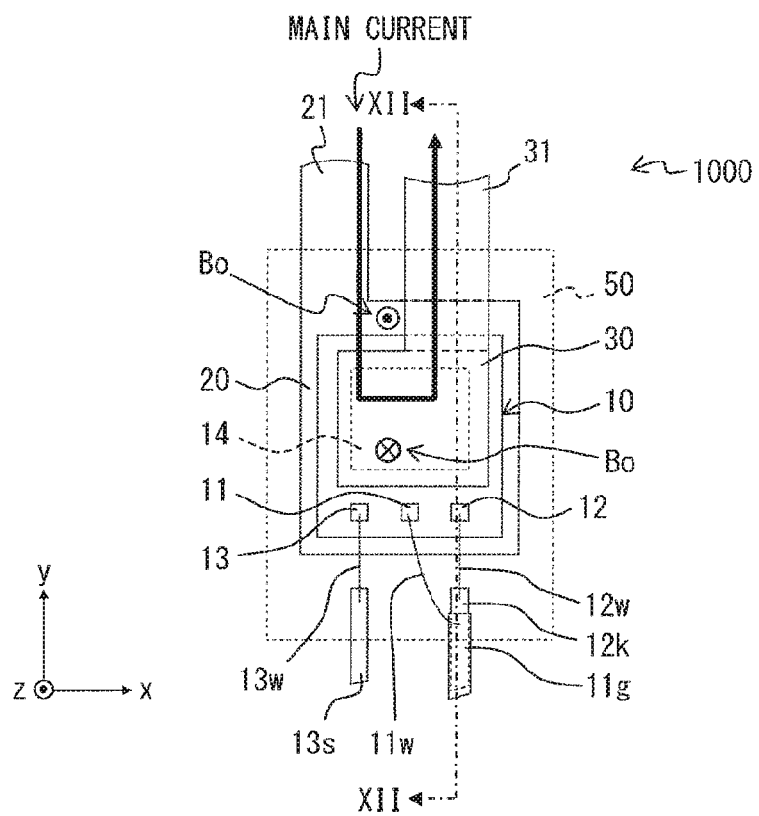
FIG. 11 is a top view illustrating a schematic configuration of a semiconductor device according to a third embodiment.
Figure 12:
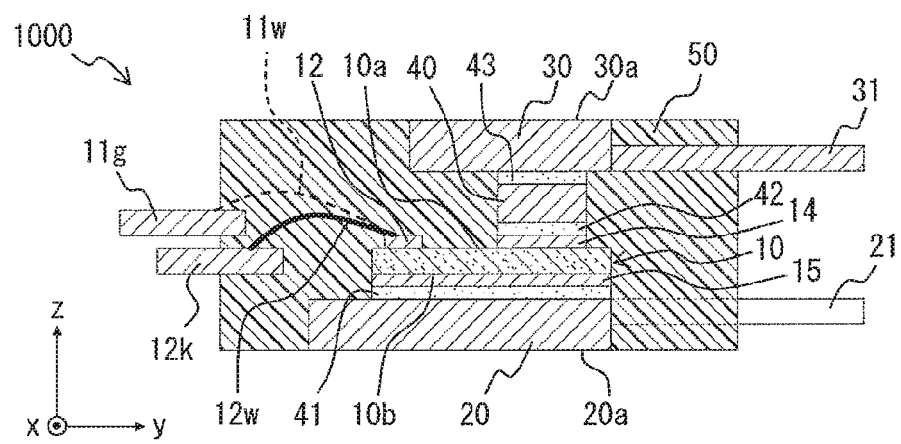
FIG. 12 is a cross-sectional view of the semiconductor element taken along a line XII-XII in FIG. 11.

As illustrated in FIG. 11, a semiconductor device 1000 according to this embodiment is formed in such a manner that a collector terminal 21 and an emitter terminal 31 are spaced apart from each other in an x-direction when those terminals 21 and 31 are positively projected onto an xy-plane, as compared with the first embodiment. On the other hand, a gate terminal 11g and a Kelvin emitter terminal 12k are formed to overlap with each other when those terminals are projected onto the xy-plane. The gate terminal 11g and the Kelvin emitter terminal 12k are spaced apart from each other in a z-direction as indicated by FIG. 12.

In the above configuration, as illustrated in FIG. 11, a main magnetic flux Bo generated around a current path of a main current is produced in parallel to a yz-plane. On the other hand, because the gate terminal 11g and the Kelvin emitter terminal 12k are arranged on the same plane along the yz-plane, a control current is produced substantially in parallel to the yz-plane. For that reason, when the current path of the control current is regarded as a one-turn coil, the main magnetic flux Bo can be restricted from being interlinked with the current path of the control current. With the above configuration, the induced electromotive force can be restrained from being generated in the current path of the control current. In other words, the coupling coefficient k can be set to substantially zero. Therefore, the overshoot of the main current and the delay of the response speed of the switching element can be suppressed.

Fourth Embodiment

Figure 13:
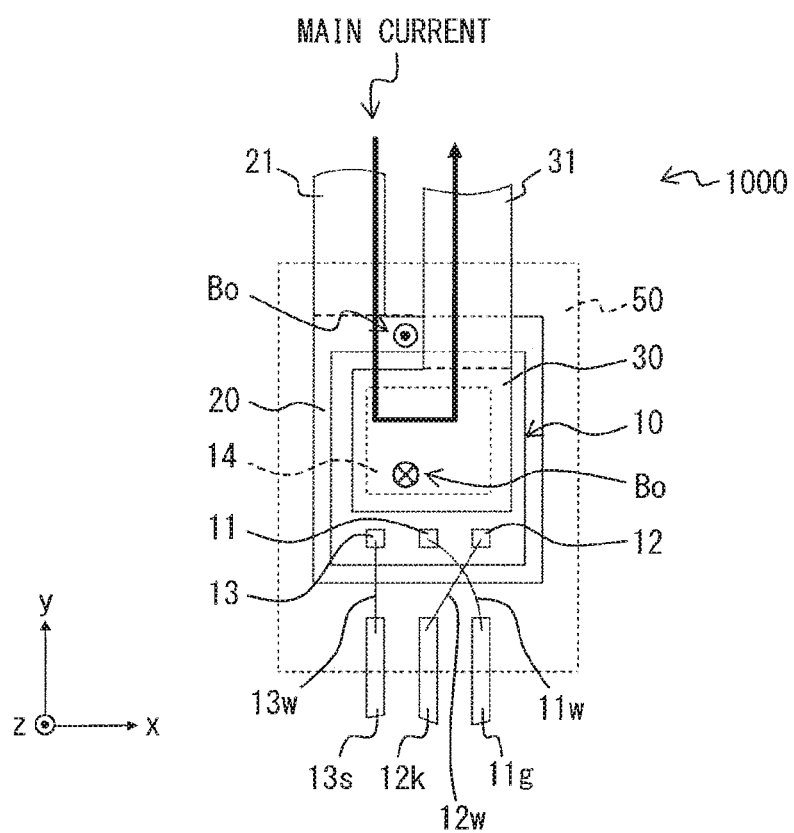
FIG. 13 is a top view illustrating a schematic configuration of a semiconductor device according to a fourth embodiment.
Figure 14:
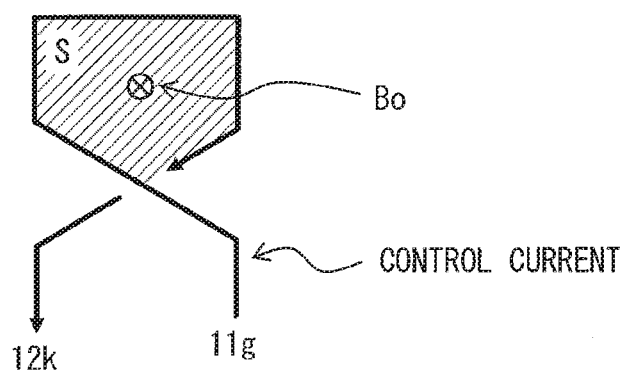
FIG. 14 is a diagram illustrating a current path of a control current.

As illustrated in FIG. 13, a semiconductor device 1000 according to this embodiment is formed in such a manner that a collector terminal 21 and an emitter terminal 31 are spaced apart from each other in an x-direction when those terminals 21 and 31 are projected onto an xy-plane, as compared with the first embodiment. The gate terminal 11g and the Kelvin emitter terminal 12k are spaced apart from each other in the x-direction when those terminals 11g and 12k are projected onto the xy-plane. As illustrated in FIG. 14, an arrangement of the gate electrode 11 and the Kelvin emitter electrode 12 is opposite to an arrangement of the gate terminal 11g and the Kelvin emitter terminal 12k in the x-direction. For that reason, bonding wires 11w and 12w are formed to intersect with each other.

In the above configuration, a plane along which a current path of the main current extends is substantially in parallel to the xy-plane, and a plane along which a current path of the control current extends is substantially in parallel to the xy-plane. Hence, because the main magnetic flux Bo attributable to the main current is interlinked with the current path of the control current when the current path of the control current is regarded as a one-turn coil, an induced electromotive force may be generated in the current path of the control current.

However, in this embodiment, the bonding wires 11w and 12w are formed to intersect with each other, whereby the current paths of the control current intersect with each other in the xy-plane as illustrated in FIG. 14. For that reason, an area S in which the main magnetic flux Bo is interlinked can be reduced as compared with a configuration in which the bonding wires 11w and 12w do not intersect with each other. Therefore, the induced electromotive force generated in the current path of the control current can be suppressed. In other words, an absolute value of the coupling coefficient k can be reduced.

Fifth Embodiment

Figure 15:
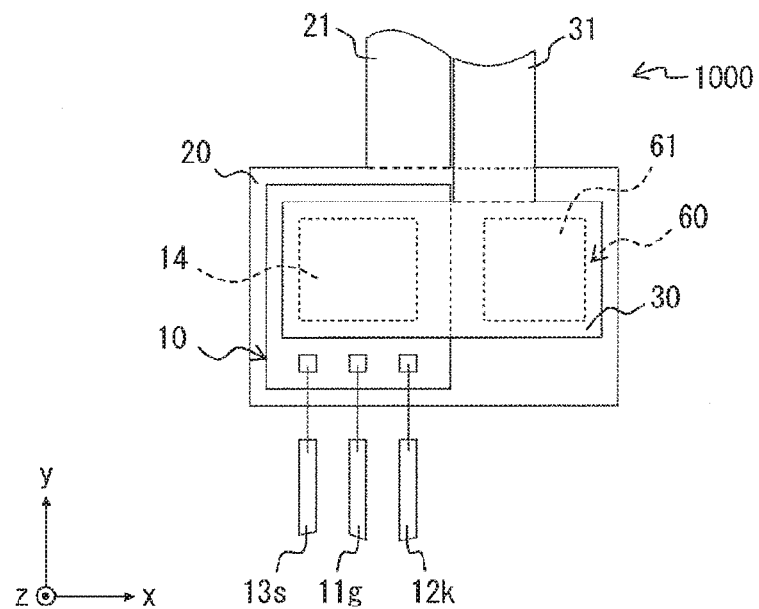
FIG. 15 is a top view illustrating a schematic configuration of a semiconductor device according to a fifth embodiment.
Figure 16:
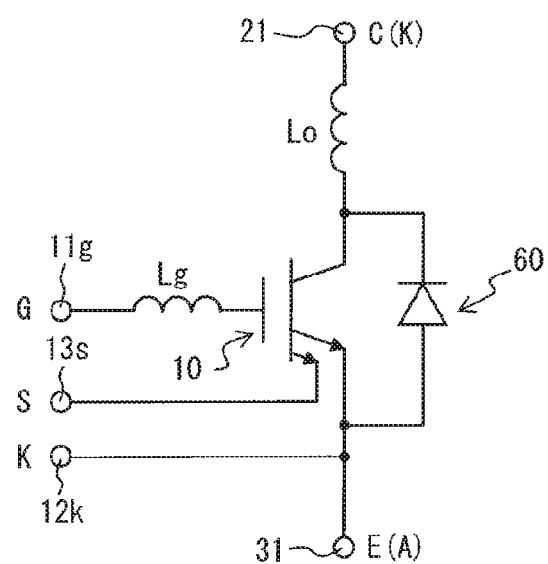
FIG. 16 is an equivalent circuit diagram of the semiconductor device.

The above respective embodiments exemplify the configuration in which the semiconductor device 1000 includes only the IGBT chip 10 formed with the insulated gate bipolar transistor as a semiconductor chip. In this embodiment, as illustrated in FIGS. 15 and 16, a description will be given of a configuration in which a semiconductor device 1000 is equipped with a reflux diode chip (FWD chip) 60 in addition to the IGBT chip 10.

The semiconductor device 1000 is configured to dispose the FWD chip 60 between a first heat sink 20 and a second heat sink 30 in the first embodiment through a conductive adhesive not shown. Specifically, the FWD chip is formed into a flat plate that is rectangular in a planar shape and extends along an xy-plane. The FWD chip includes a cathode electrode 61 on one surface orthogonal to a z-direction as a pad P, and an anode electrode not shown on its rear surface. The cathode electrode 61 is electrically connected to the second heat sink 30, and the anode electrode is electrically connected to the first heat sink 20. Hence, as illustrated in FIG. 16, the collector terminal 21 also serves as a cathode terminal for the FWD chip 60, and the emitter terminal 31 also serves as an anode terminal. In other words, the IGBT chip 10 and the FWD chip 60 are connected in parallel between the collector terminal 21 and the emitter terminal 31. In FIG. 15, a sealing resin body 50 is omitted from illustration.

Also in this embodiment, similarly to the first embodiment, the collector terminal 21 and the emitter terminal 31 are extended in a direction opposite to the extending direction of the control terminals 11g, 12k, and 13s in the y-direction, and arranged so that the distance between those terminals are adjacent to each other without any gap when the collector terminal 21 and the emitter terminal 31 are projected onto the xy-plane. For that reason, when the current path of the main current flowing into the emitter terminal 31 from the collector terminal 21 through the IGBT chip 10 and the FWD chip 60 is regarded as a one-turn coil, an area in which the main magnetic flux Bo is interlinked can be set to substantially zero. Therefore, the same operation and advantages as those in the above first embodiment can be obtained.

Sixth Embodiment

In the fifth embodiment, the insulated gate bipolar transistor and the reflux diode are formed of different semiconductor chips 10 and 60, respectively. On the contrary, in this embodiment, as illustrated in FIGS. 17 and 18, a configuration having RC-IGBT chips 70 and 75 in which an insulated gate bipolar transistor and a reflux diode are incorporated into the same semiconductor chip as the semiconductor chip will be described.

The semiconductor device 1000 according to this embodiment includes two of a first RC-IGBT chip 70 and a second RC-IGBT chip 75 as the semiconductor chips. The semiconductor device 1000 also includes heat sinks 80 to 83, and multiple lead terminals T1 (71g, 72k, 73s, 76g, 77k, 78s) and T2 (85, 86, 87). Those components are molded with a sealing resin body 50 so as to project parts of the lead terminals T1 and T2 from the sealing resin body 50. Referring to FIG. 17, for convenience, the sealing resin body 50 is not illustrated.

Figure 17:
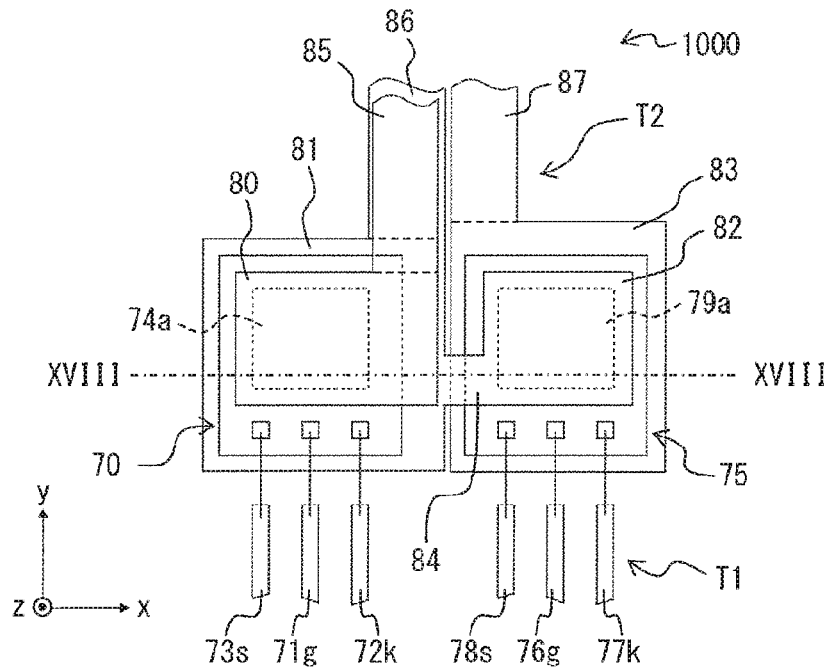
FIG. 17 is a top view illustrating a schematic configuration of a semiconductor device according to a sixth embodiment.

As illustrated in FIG. 17, the RC-IGBT chips 70 and 75 are each formed into a flat plate along an xy-plane, and arranged side by side in an x-direction. As with the IGBT chip 10 in the above embodiments, the RC-IGBT chips 70 and 75 are connected with gate terminals 71g, 76g, Kelvin emitter terminals 72k, 77k, and current sense terminals 73s, 78s. Those control terminals are arranged side by side in the x-direction on the same plane along the xy-plane, and extended in the same y-direction. The RC-IGBT chips 70 and 75 include emitter electrodes 74a, 79a and collector electrodes 74b, 79b, respectively.

Figure 18:
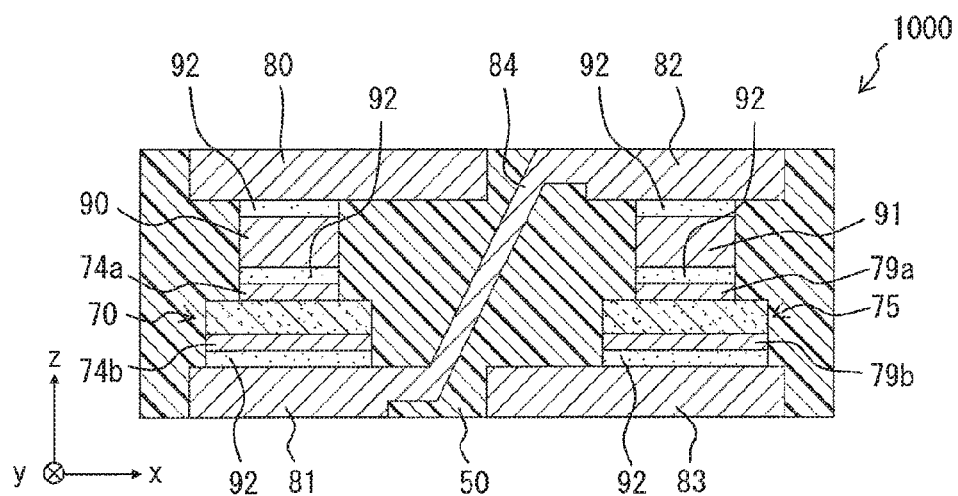
FIG. 18 is a cross-sectional view of the semiconductor element taken along a line XVIII-XVIII in FIG. 17.

As illustrated in FIG. 18, the emitter electrode 74a of the first RC-IGBT chip 70 is fixed to the third heat sink 80 through a spacer 90. The collector electrode 74b of the first RC-IGBT chip 70 is fixed to the fourth heat sink 81. The emitter electrode 79a of the second RC-IGBT chip 75 is fixed to the fifth heat sink 82 through a spacer 91. The collector electrode 79b of the second RC-IGBT chip 75 is fixed to the sixth heat sink 83. All of the fixations of those electrodes are performed through a conductive adhesive 92. The fourth heat sink 81 and the fifth heat sink 82 are electrically connected to each other by a relay member 84.

Figure 19:
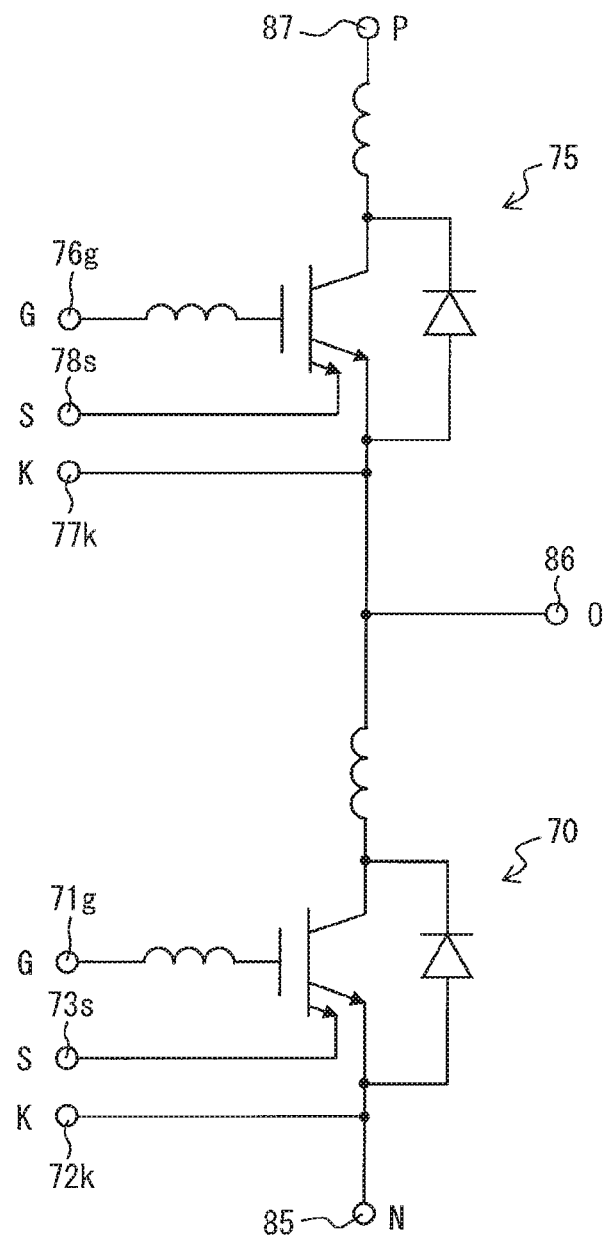
FIG. 19 is an equivalent circuit diagram of the semiconductor device.

As illustrated in FIG. 17, the third heat sink 80 is connected integrally with the low potential terminal 85 as the main terminal. The fourth heat sink 81 is connected integrally with the output terminal 86 as the main terminal. Further, the sixth heat sink 83 is connected integrally with the high potential terminal 87 as the main terminal. In other words, as illustrated in FIG. 19, the first RC-IGBT chip 70 and the second RC-IGBT chip 75 are connected in series with each other between the high potential terminal 87 and the low potential terminal 85, and the output terminal 86 is formed at a midpoint between the first RC-IGBT chip 70 and the second RC-IGBT chip 75.

As illustrated in FIG. 17, the output terminal 86 and the high potential terminal 87 in this embodiment are arranged adjacent to each other without any gap when those terminals are projected onto the xy-plane. The low potential terminal 85 is formed adjacent to the high potential terminal 87 without any gap while substantially completely overlapping with the output terminal 86 when the low potential terminal 85 is projected onto the xy-plane.

For that reason, an area in which the main magnetic flux to be developed by the main current per se flowing between the output terminal 86 and the high potential terminal 87 is interlinked is substantially zero. Therefore, as in the first embodiment, the strength of the main magnetic flux can be set to substantially zero, which enables the coupling coefficient k to be set to substantially zero. Likewise, an area in which the main magnetic flux to be developed by the main current per se flowing between the low potential terminal 85 and the high potential terminal 87 is interlinked is substantially zero. Therefore, the strength of the main magnetic flux can be set to substantially zero. Further, a plane along which the main magnetic flux to be developed by the main current per se flowing between the output terminal 86 and the low potential terminal 85 extends is substantially in parallel to the xy-plane. In this embodiment, because the control terminals 71g, 72k, 73s, 76g, 77k, and 78s are arrayed side by side in the x-direction, the control current flows along the current path substantially in parallel to the xy-plane. As described above, since the main magnetic flux and the current path of the control current are substantially in parallel to each other, the coupling coefficient k can be set to substantially zero as in the second embodiment.

Seventh Embodiment

Figure 20:
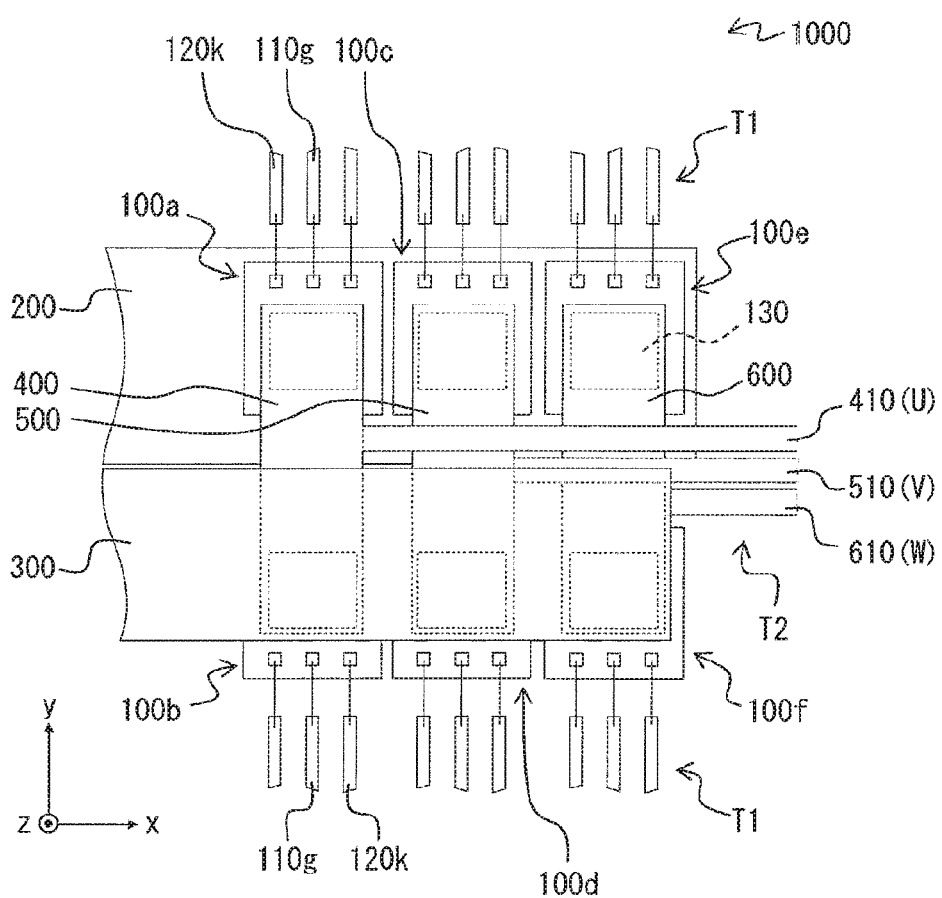
FIG. 20 is a top view illustrating a schematic configuration of a semiconductor device according to a seventh embodiment.
Figure 21:
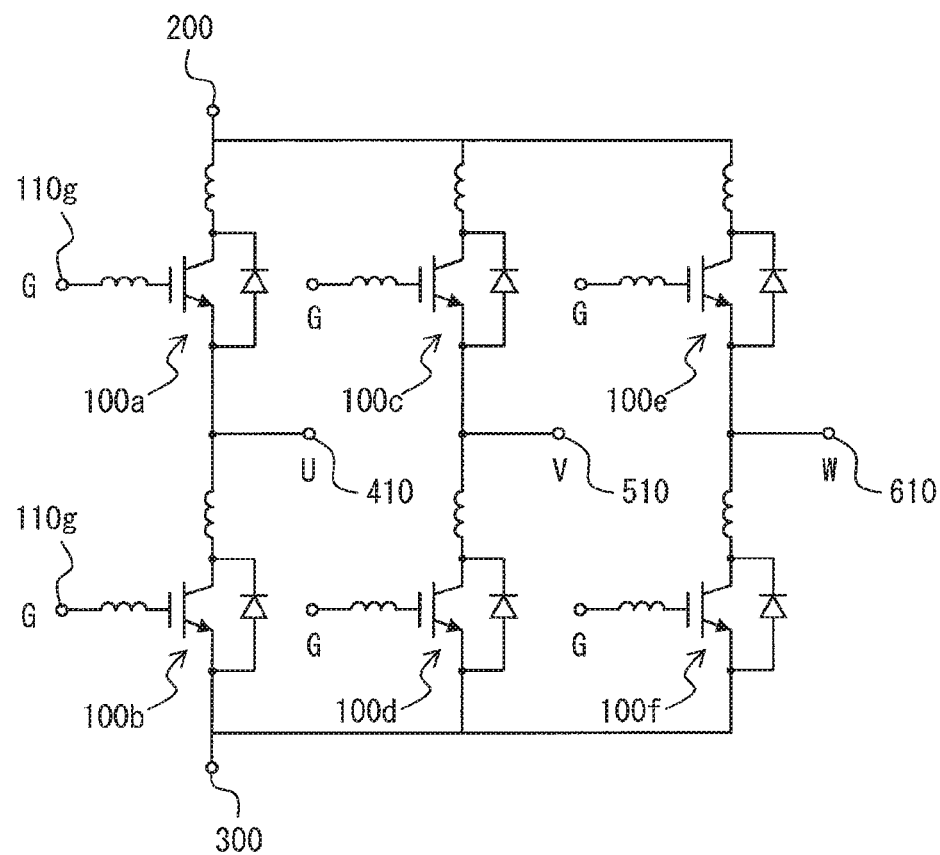
FIG. 21 is an equivalent circuit diagram of the semiconductor device.

The sixth embodiment exemplifies the semiconductor device 1000 having the circuit configured by the two RC-IGBT chips 70 and 75. On the contrary, in this embodiment, as illustrated in FIGS. 20 and 21, a circuit is configured by six RC-IGBT chips 100a to 100f. Since the RC-IGBT chips are identical with the RC-IGBT chip 70 or 75 in the sixth embodiment, the arrangement of the emitter electrode and the collector electrode will be omitted from description.

As illustrated in FIG. 20, the semiconductor device 1000 includes the six RC-IGBT chips 100a to 100f each of which has at least a gate terminal 1109 and a Kelvin emitter terminal 120k. The RC-IGBT chips 100a to 100f are arranged on the same plane along the xy-plane. In particular, the RC-IGBT chips 100a, 100c, and 100e are arranged side by side in the x-direction, and the RC-IGBT chips 100b, 100d, and 100f are arranged at positions arrayed in the y-direction with respect to the respective chips.

The RC-IGBT chips 100a, 100c, and 100e are electrically connected with a seventh heat sink 200 common to the respective collector electrodes. The RC-IGBT chips 100b, 100d, and 100f are electrically connected with an eighth heat sink 300 common to the respective emitter electrodes 130. The seventh heat sink 200 obtains the effect of heat radiation, and also serves as the high potential terminal (hereinafter designated with reference numeral 200) as the main terminal. The eighth heat sink 300 obtains the effect of heat radiation, and also serves as the low potential terminal (hereinafter designated with reference numeral 300) as the main terminal.

An emitter electrode 130 of the RC-IGBT chip 100a and a collector electrode of the RC-IGBT chip 100b are electrically connected to each other by a relay line 400, and an output terminal 410 is formed to extend from the relay line 400 in the x-direction. The emitter electrode 130 of the RC-IGBT chip 100c and the collector electrode of the RC-IGBT chip 100d are electrically connected to each other by a relay line 500, and an output terminal 510 is formed to extend from the relay line 500 in the x-direction. The emitter electrode 130 of the RC-IGBT chip 100e and the collector electrode of the RC-IGBT chip 100f are electrically connected to each other by a relay line 600, and an output terminal 610 is formed to extend from the relay line 600 in the x-direction.

The high potential terminal 200 and the low potential terminal 300 in this embodiment are arranged adjacent to each other without any gap when those terminals are projected onto the xy-plane. For that reason, an area in which the main magnetic flux to be developed by the main current per se flowing between the high potential terminal 200 and the low potential terminal 300 is interlinked is substantially zero. Therefore, as in the first embodiment, the strength of the main magnetic flux can be set to substantially zero, which enables the coupling coefficient k to be set to substantially zero.

Eighth Embodiment

Figure 22:
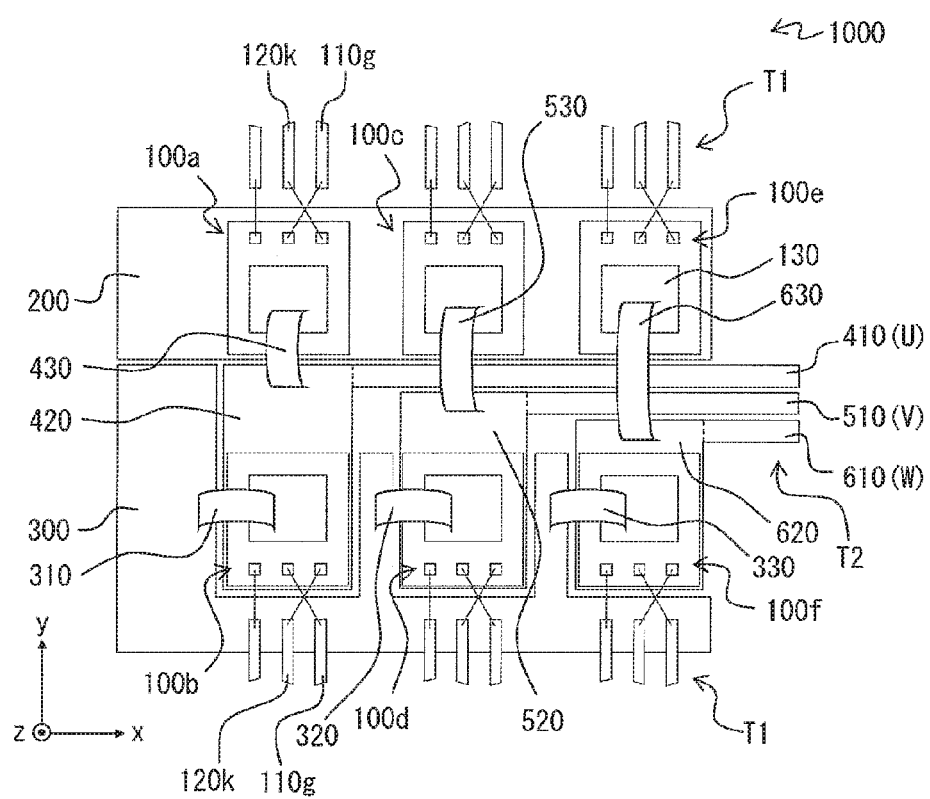
FIG. 22 is a top view illustrating a schematic configuration of a semiconductor device according to an eighth embodiment.

The seventh embodiment shows an example in which the high potential terminal 200 and the low potential terminal 300 are arranged at different z-coordinates. In other words, the seventh embodiment shows an example in which heights at which the high potential terminal 200 and the low potential terminal 300 are disposed are different from each other. This embodiment shows an example in which as illustrated in FIG. 22, the high potential terminal 200, the low potential terminal 300, and the output terminals 410, 510, 610 are arranged on the same plane along the xy-plane.

In addition to the above configuration, the positions of the gate terminals 110g and the Kelvin emitter terminal 120k are replaced with each other as compared with the configuration of the seventh embodiment. In other words, the current paths of the control current intersect with each other when the current paths are projected onto the xy-plane.

The RC-IGBT chips 100a, 100c, and 100e have the respective collector electrodes connected with the high potential terminal 200. The RC-IGBT chips 100b, 100d, and 100f have the respective emitter electrodes 130 connected with the low potential terminal 300 through conductive ribbons 310, 320, and 330 made of copper.

The emitter electrode 130 of the RC-IGBT chip 100a and the collector electrode of the RC-IGBT chip 100b are electrically connected to each other by a conductive plate 420 disposed on the same plane such as the low potential terminal 300, and a conductive ribbon 430. The output terminal 410 is formed to extend from the conductive plate 420 in the x-direction in a region between the RC-IGBT chips 100a and 100b. The emitter electrode 130 of the RC-IGBT chip 100c and the collector electrode of the RC-IGBT chip 100d are electrically connected to each other by a conductive plate 520 disposed on the same plane such as the low potential terminal 300, and a conductive ribbon 530. The output terminal 510 is formed to extend from the conductive plate 520 in the x-direction in a region between the RC-IGBT chips 100c and 100d. Likewise, the emitter electrode 130 of the RC-IGBT chip 100e and the collector electrode of the RC-IGBT chip 100f are electrically connected to each other by a conductive plate 620 disposed on the same plane such as the low potential terminal 300, and a conductive ribbon 630. The output terminal 610 is formed to extend from the conductive plate 620 in the x-direction in a region between the RC-IGBT chips 100e and 100f.

In this embodiment, since the high potential terminal 200 and the low potential terminal 300 are disposed on the same plane, a distance between those terminals cannot be set to zero. For that reason, the strength of the main magnetic flux can be reduced with a reduction in the distance between those terminals as much as possible, and the coupling coefficient k can be reduced. However, when the distance between those terminals is too small, a short-circuit failure may occur. In this embodiment, the positions of the gate terminal 110g and the Kelvin emitter terminal 120k are replaced with each other, and the current paths of the control current intersect with each other in the xy-plane, as compared with the seventh embodiment. For that reason, even if the strength of the main magnetic flux cannot be set to zero, the area S in which the main magnetic flux is interlinked in the current path of the control current can be reduced. Therefore, the eighth embodiment can obtain the same effects as those in the fourth embodiment.

Other Embodiments

The present disclosure is not limited to the above-mentioned embodiments, and can be implemented with various modifications without departing from the gist of the present disclosure.

Figure 23:
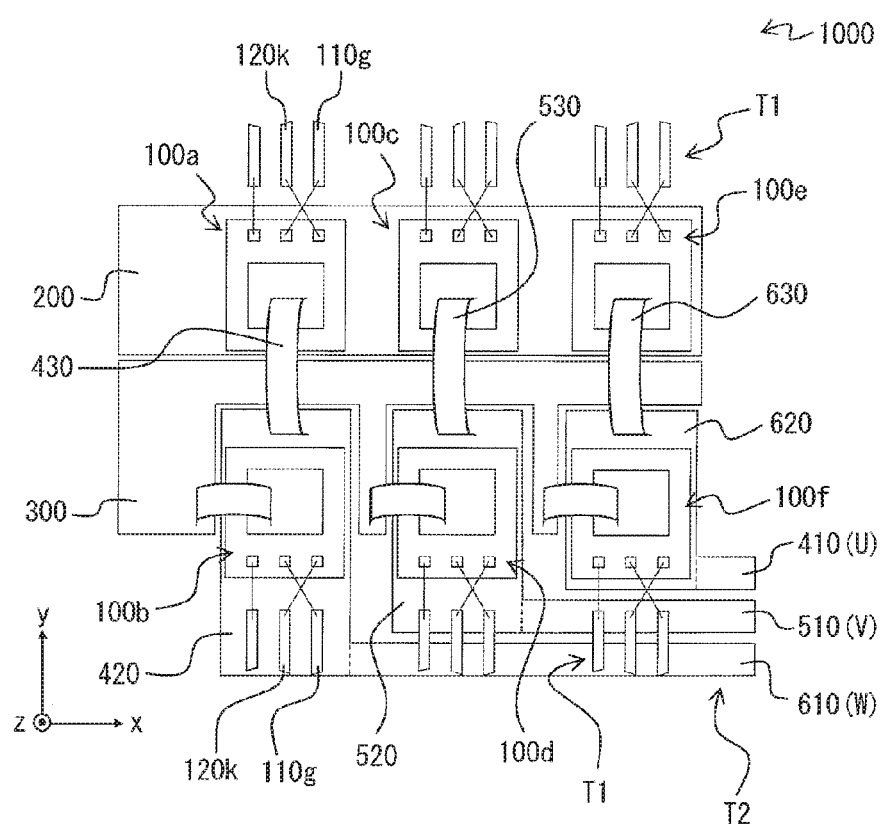
FIG. 23 is a top view illustrating a schematic configuration of a semiconductor device according to another embodiment.

In the eighth embodiment, the output terminals 410, 510, and 610 are formed in the regions between the RC-IGBT chips 100a and 100b, between the RC-IGBT chips 100c and 100d, and between the RC-IGBT chips 100e and 100f, respectively. However, the layout of the output terminals 410, 510, and 610 is not limited. For example, as illustrated in FIG. 23, the output terminal 410 may be disposed on an opposite side of the RC-IGBT chip 100a with respect to the RC-IGBT chip 100b. The same is applied to the output terminals 510 and 610. Similarly, in an example illustrated in FIG. 23, the high potential terminal 200 and the low potential terminal 300 as the main terminals are disposed in such a manner that a distance between those terminals is reduced. With the above configuration, as in the eighth embodiment, the strength of the main magnetic flux attributable to the main current can be reduced, and the coupling coefficient k can be reduced.

In the fifth embodiment, the sixth embodiment, and the seventh embodiment, the positions of the gate terminal 11g and the Kelvin emitter terminal 12k may be replaced with each other. In other words, the arrangement of the gate electrode 11 and the Kelvin emitter electrode 12 may be opposite to the arrangement of the gate terminal 11g and the Kelvin emitter terminal 12k in the x-direction. With the above configuration, the current paths of the control current can be configured to intersect with each other in the xy-plane, and an area in which the main magnetic flux is interlinked with the current path of the control current can be reduced.

In the first embodiment, the collector terminal 21 and the emitter terminal 31 are disposed adjacent to each other without any gap in the x-direction when those terminals are positively projected onto the xy-plane, and the gate terminal 11g and the Kelvin emitter terminal 12k are disposed to be spaced apart from each other in the x-direction. The above configuration may be reversed. In other words, the collector terminal 21 and the emitter terminal 31 may be disposed to be spaced apart from each other in the x-direction when those terminals are positively projected onto the xy-plane, and the gate terminal 11g and the Kelvin emitter terminal 12k may be disposed adjacent from each other without any gap in the x-direction.

The invention claimed is:

1. A semiconductor device comprising:
   a semiconductor chip having a switching element and a plurality of pads (P) electrically connected to the switching element; and
   a plurality of lead terminals being electrically connected to the respective pads, wherein
   the plurality of lead terminals includes a control terminal used for control of on/off operation of the switching element, and a main terminal into which a current flows when the switching element is in an on state,
   the control terminal includes a first terminal and a second terminal between which a control current flows through the semiconductor chip when the switching element is in the on state,
   the main terminal includes a third terminal and a fourth terminal between which a main current flows through the semiconductor chip when the switching element is in the on state, and
   a coupling coefficient k satisfies −3%≤k≤2%, when k is defined by $$k = Ms/(Lg \times Lo)^{1/2}$$

where Lg is a parasitic inductance in a current path of the control current, Lo is a parasitic inductance in a current path of the main current, and Ms is a mutual inductance of the parasitic inductance Lg and the parasitic inductance Lo.

2. The semiconductor device according to claim 1, wherein
   when an x-direction, a y-direction orthogonal to the x-direction, and a z-direction orthogonal to an xy-plane defined by the x-direction and the y-direction are defined,
   the first terminal and the second terminal are spaced apart from each other on a same plane along the xy-plane, and
   the third terminal and the fourth terminal are arranged at different z-coordinates from each other, and adjacent to each other without a gap when being positively projected onto the xy-plane.

3. The semiconductor device according to claim 1, wherein
   when an x-direction, a y-direction orthogonal to the x-direction, and a z-direction orthogonal to an xy-plane defined by the x-direction and the y-direction are defined,
   the third terminal and the fourth terminal are spaced apart from each other on a same plane along the xy-plane, and
   the first terminal and the second terminal are arranged at different z-coordinates from each other, and adjacent to each other without a gap when being positively projected onto the xy-plane.

4. The semiconductor device according to claim 1, wherein
   when an x-direction, a y-direction orthogonal to the x-direction, and a z-direction orthogonal to an xy-plane defined by the x-direction and the y-direction are defined,
   the first terminal and the second terminal are spaced apart from each other on a same plane along the xy-plane, and
   the third terminal and the fourth terminal are arranged at different z-coordinates from each other, and overlap with each other when being positively projected onto the xy-plane.

5. The semiconductor device according to claim 1, wherein when an x-direction, a y-direction orthogonal to the x-direction, and a z-direction orthogonal to an xy-plane defined by the x-direction and the y-direction are defined, the third terminal and the fourth terminal are spaced apart from each other on a same plane along the xy-plane, and the first terminal and the second terminal are arranged at different z-coordinates from each other, and overlap with each other when being positively projected onto the xy-plane.

6. The semiconductor device according to claim 1, further comprising a plurality of bonding wires electrically connecting the plurality of pads with the corresponding lead terminals, wherein when an x-direction, a y-direction orthogonal to the x-direction, and a z-direction orthogonal to an xy-plane defined by the x-direction and the y-direction are defined, the third terminal and the fourth terminal are spaced apart from each other in the x-direction on a same plane along the xy-plane, and extend from the semiconductor chip in the y-direction, and the first terminal and the second terminal are arranged on a same plane along the xy-plane, and the bonding wires connecting the first terminal and the second terminal with the corresponding pads intersect with each other on at least one location when the bonding wires are positively projected onto the xy-plane.

7. The semiconductor device according to claim 1, wherein the switching element is an insulated gate bipolar transistor, the first terminal is a gate terminal electrically connected to a gate of the insulated gate bipolar transistor, the second terminal is a Kelvin emitter terminal electrically connected to an emitter of the insulated gate bipolar transistor, the third terminal is an emitter terminal electrically connected to an emitter of the insulated gate bipolar transistor, and the fourth terminal is a collector terminal electrically connected to a collector of the insulated gate bipolar transistor.

* * * * *